United States Patent [19]

Loewenstein

[11] 4,366,474

[45] Dec. 28, 1982

[54] IDENTIFICATION OF ELECTRIC POWER NETWORK PHASES EXPERIENCING DISTURBANCES

[75] Inventor: Paul Loewenstein, Paris, France

[73] Assignee: Enertec, Montrouge, France

[21] Appl. No.: 253,969

[22] Filed: Apr. 13, 1981

[30] Foreign Application Priority Data

Apr. 15, 1980 [FR] France ............................... 80 08428

[51] Int. Cl.³ .......................................... G08B 21/00
[52] U.S. Cl. .................................. 340/658; 340/651; 340/661; 361/85
[58] Field of Search ............... 340/661, 650, 651, 663, 340/664, 518, 658, 652, 644; 361/85

[56] References Cited

U.S. PATENT DOCUMENTS

| | | | |
|---|---|---|---|
| 3,401,308 | 9/1968 | Darke | 340/658 X |
| 3,626,281 | 12/1971 | Souillard | 361/85 X |
| 3,641,394 | 2/1972 | Hirose et al. | 340/644 X |
| 3,783,341 | 1/1974 | Beckwith | 361/85 |
| 4,007,401 | 2/1977 | Kimmel et al. | 340/664 X |
| 4,053,876 | 10/1977 | Taylor | 340/664 X |
| 4,241,336 | 12/1980 | Schonken | 340/518 |
| 4,251,766 | 2/1981 | Souillard | 324/52 |
| 4,301,491 | 11/1981 | Gryctko | 340/664 X |
| 4,333,050 | 6/1982 | Yeasting | 340/661 X |

Primary Examiner—John W. Caldwell, Sr.
Assistant Examiner—Daniel Myer
Attorney, Agent, or Firm—Dale V. Gaudier

[57] ABSTRACT

A system for identifying which of the phases of an N-phase electric-power transmission network has experienced an electrical disturbance. For each phase there is produced a first signal representative of the transient variations of an electrical parameter of the respective phase, or of a linear combination of at least two of these parameters. A set of N second signals is generated from the product of two linear combinations of at least N−1 signals selected among the first signals. The sum of all coefficients for each linear combination is set to zero, with each of the second signals being related to a given phase. Each of the second signals is then integrated to produce a set of N third signals associated with the respective phases. A fourth signal is generated by combining all of the N first signals in a symmetrical manner with respect to all of the first signals, such that the fourth signal is independent of the associated phases. The fourth signal is compared with each of the third signals to produce comparison signals related to respective phases; the faulty phase is identified in accordance with the comparison signals thus produced.

5 Claims, 3 Drawing Figures

IDENTIFICATION OF ELECTRIC POWER NETWORK PHASES EXPERIENCING DISTURBANCES

This invention relates to the identification of electric-power network phases experiencing disturbances, and in particular to methods and apparatus for identifying which of the phases in a three-phase electric-power transmission network has experienced an electrical disturbance.

Electric disturbances on A.C. electric-power transmission networks can arise from a variety of causes, such as the switching in and out of generators and loads, or the occurrence of faults (for example, short-circuits to ground, or between phases). The detection of these disturbances provides an important means for detecting faults so that remedial action (typically, the disconnection of a faulty line or other equipment) can be taken, but obviously it is necessary to distinguish disturbances due to faults from those due to routine operation of the network if spurious action is to be avoided. Furthermore, since major damage to the network can result if a fault is permitted to persist for even a few milliseconds, very fast operation of equipment for detecting and isolating faults is desirable.

In the particular case of three-phase networks, two different types of fault can be usefully distinguished: the first type of fault involves a spurious connection between a single one of the phases and ground, whereas the second type includes all other possible fault conditions, such as a spurious connection between different phases.

The first type of fault may well be of a temporary nature, for example due to moisture on an insulator; in this case an initial, temporary disconnection of only the faulty phase is worth while, to allow time for the fault possibly to clear itself, and disconnection of all three phases need only be effected if the fault persists. On the other hand, the second type of fault requires immediate disconnection of all three phases.

There is provided according to the invention a method for identifying which of the phases in a N-phase electric-power transmission network has experienced a fault, comprising the steps of
producing for each phase a first signal representative of the transient variations of an electrical parameter of the respective phase, or of a linear combination of at least two of said parameters;
generating a set of N second signals as the product of two linear combinations of at least $N-1$ signals selected among said first signals, the sum of all coefficients for each linear combination being nil, each of said second signals being related to a given phase;
integrating with respect to time each of said second signals to produce a set of N third signals associated with respective phases;
generating a fourth signal by combining all of the N first signals in a symmetrical manner with respect to all of said first signals, whereby said fourth signal is independent of the associated phases;
comparing said fourth signal with each of said third signals to produce comparison signals related to respective phases; and
identifying the faulty phase in accordance with the comparison signals thus produced.

A method in accordance with this invention for identifying the faulty phase or phases in a three-phase electric power transmission network will now be described, by way of example, with reference to the accompanying drawings, in which.

Figure 1:
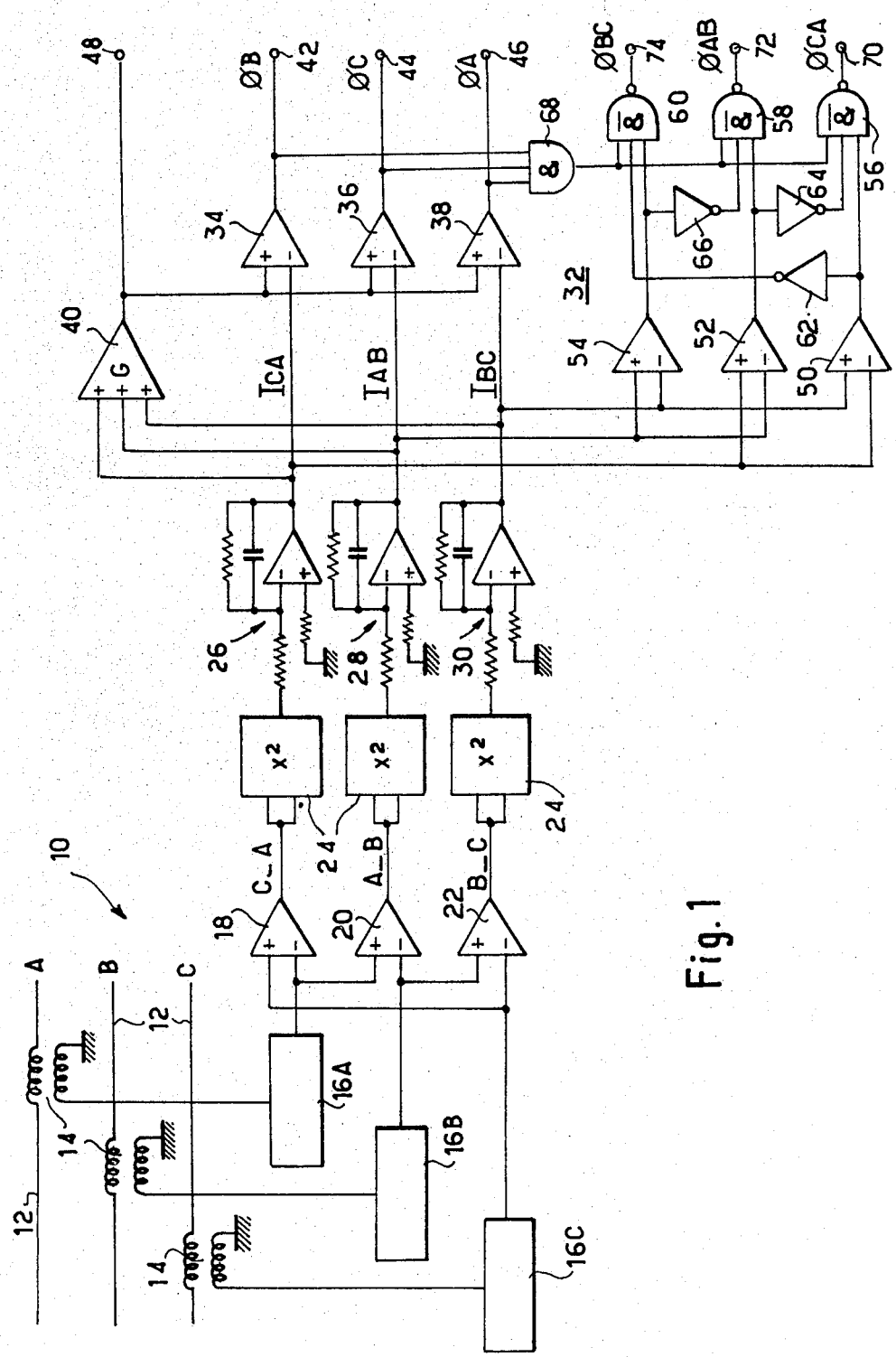
FIG. 1 is a block schematic circuit diagram of the apparatus.

The apparatus to be described, shown in FIG. 1, is intended for use with a three-phase power line, in which each phase carries alternating current, typically at a power frequency of 50 or 60 Hz, and at a phase angle of 120° relative to each of the other phases.

Referring to FIG. 1, a power line 10 has three conductors 12 providing three phases A, B and C. For each phase there is a respective current transducer 14, such as a current transformer, which provides an output voltage signal representative of the instantaneous magnitude and polarity of the current in the respective conductor 12.

The output signals from the transducers 14 are supplied to respective filters 16. The design of these filters depends on the particular circumstances of use of the apparatus, but the purpose in every case is to block the passage of any component of the input signals to the filters which in representative of the currents measured by the transducers 14 in the power line 10 during ordinary operation free from faults or other sources of disturbance. The filters 16 may be, for example, notch filters tuned to reject the power frequency; alternatively they might be arranged to store and compare successive short samples of the current signal waveforms, as described in U.S. Pat. No. 4,251,766. In any case, the output signals of the filters 16 are representative solely of transient currents occurring in the power line 10 as a result of faults, switching operations or other sources of electrical disturbance.

These output signals are supplied to the inputs of three differential amplifiers 18, 20 and 22 in respective pairs as follows:
the differential amplifier 18 receives the output signal form the filter 16A (coupled to phase A) at its inverting input and the output signal of the filter 16C (coupled to phase C) at its non-inverting input; the differential amplifier 20 receives the output signal of the filter 16B (coupled to phase B) at its inverting input and the output of the filter 16A at its non-inverting input; and the differential amplifier 22 receives the output signal of the filter 16C at its inverting input and the output signal of the filter 16B at its non-inverting input. Thus the differential amplifier 18 forms the difference signal $C-A$; the differential amplifier 20 forms the difference signal $A-B$; and the differential amplifier 22 forms the difference signal $B-C$.

These three difference signals are supplied to respective ones of three squaring circuits 24, which are in turn coupled to the inputs of respective integrators 26, 28 and 30. Each of these integrators 26, 28 and 30 has a capacitor and a resistor coupled in parallel to feed back from the output of the integrator to its inverting input, which also receives the output signal of the respective squaring circuit 24. The value of the resistor is chosen so that, in the absence of any input signal, any charge on the associated capacitor leaks away with a time constant of a few seconds. This ensures that noise and other unwanted signals from the respective squaring circuit 24 cannot cause the associated integrator to generate an output signal of significant magnitude.

The outputs from the integrators 26, 28 and 30, representative respectively of the functions $$I_{CA} \simeq -\int (C-A)^2 dt;$$

$$I_{AB} \simeq -\int (A-B)^2 dt;$$

$$I_{BC} \simeq -\int (B-C)^2 dt$$

are coupled to a monitoring circuit indicated generally at 32. A first portion of this monitoring circuit 32 comprises 3 comparators 34, 36 and 38 and a summing amplifier 40 having a gain G. The inverting input of each comparator 34, 36 and 38 is coupled to receive a respective one of the signals, $I_{CA}$, $I_{AB}$ and $I_{BC}$, these three signals also being supplied to the inputs of the summing amplifier 40. The non-inverting inputs of the comparators 34, 36 and 38 are coupled to receive the output signal of the summing amplifier 40. The outputs of the four circuits 34 to 40 are coupled to respective output terminals 42 to 48.

The gain G of the summing amplifier 40 is set somewhat lower than the value given by the function $$\tfrac{1}{3} \sin^2 15°$$

A second portion of the monitoring circuit 32 includes three more comparators 50, 52 and 54, connected to receive the output signals of the integrators 26, 28 and 30 as follows: the comparator 50 receives the signal $I_{CA}$ at its inverting input and the signal $I_{BC}$ at its non inverting input; the comparator 52 receives the signal $I_{AB}$ at its inverting input and the signal $I_{CA}$ at its non-inverting input; and the comparator 54 receives the signal $I_{BC}$ at its inverting input and the signal $I_{AB}$ at its non-inverting input. The output of each of these comparators is supplied to the input of a respective one of three three-input NAND-gates 56, 58 and 60. In addition the output of the comparator 50 is supplied via an inverter 62 to one input of the NAND-gate 60, the output of the comparator 52 is supplied via an inverter 64 to one input of the NAND-gate 56 and the output of the integrator 54 is supplied via an inverter 66 to one input of the NAND gate 58. The remaining input of each of the NAND-gates 56, 58 and 60 is coupled to receive the output signal from an AND-gate 68 having three inputs each coupled to the output of a respective one of the comparators 34, 36 and 38. The outputs of the NAND-gates 56, 58 and 60 are coupled to respective output terminals 70, 72 and 74.

During normal, disturbance-free, operation of the power line 10, the combined effect of the filters 16 and the leakage resistors in the integrators 26, 28 and 30 prevents any significant signal appearing at the outputs of these integrators. Consequently, the comparators 34, 36 and 38 supply logic-high signals at the output terminals 42, 44 and 46 and the comparators 50, 52 and 54, operating through the associated inverters 62, 64 and 66, cause the NAND-gates 56, 58 and 60 to supply logic-high signals at the output terminals 70, 72 and 74.

In the event of a disturbance on the power line 10, the filters 16 will supply output signals indicative of the associated transient currents flowing in the three phases A, B and C to the differential amplifiers 18, 20 and 22.

These differential amplifiers will then generate signals indicative of the differences between the transient currents in each pair of phases, the circuits 24 will square the values of these differences, and the integrators 26, 28 and 30 will integrate the resulting values. As explained below, it can be shown that, if the disturbance affects only one of the three phases, the integrator output signal derived from the other two phases (that is, not from the affected phase) will remain at zero, whereas the other two integrator output signals will rise significantly. Therefore, the output of the summing amplifier 40 will also rise, providing an output signal at the terminal 48 indicative of the occurrence of a disturbance, and also providing a reference voltage to the non-inverting inputs of the comparators 34, 36 and 38. Bearing in mind the sign inversion introduced by the integrators 26, 28 and 30 it can be seen that the integrator output signal which remains at zero will therefore cause the output of the associated comparator to drop to zero. The consequent logic-low signal at the respective one of the output terminals 42, 44 and 46 indicates which of the three phases has experienced the disturbance. This same signal is also effective, via the AND-gate 68, to maintain the outputs of the NAND-gates 56, 58 and 60 at their logic-high levels.

For example, suppose that an electrical disturbance has affected only phase A of the power line 10. In these circumstances, the output signals of the integrators 26 and 28 assume significant negative values, whereas the output signal of the integrator 30 remains very close to zero. Thus, the output of the summing amplifier 40 also assumes a significant negative value, but the gain G of the amplifier 40 is chosen to ensure that this value is lower in magnitude (that is more positive) than the output signals of the integrators 26 and 28, so the comparators 34 and 36 continue to supply logic-high signals to the output terminals 42 and 44. In contrast, the output signal of the summing amplifier 40 is more negative than the zero output signal of the integrator 30, so the comparator 38 commences to supply a logic-low signal to the output terminal 46, thereby indicating that the disturbance has affected a single phase only, namely phase A.

It can also be shown that in the event of a disturbance affecting two phases, the output of the integrator 26, 28 or 30 associated with those two phases will become significantly greater than the outputs of the remaining two integrators. However, although the outputs of these two integrators become relatively low, they do not become exactly equal to zero. It can be shown that if the gain of the summing amplifier 40 is set no greater than the value indicated earlier (and in practice somewhat less to provide a realistic noise margin), the output signals of the remaining two integrators will remain greater (that is more negative) than the output terminals 42, 44 and 46 continue to provide logic-high signals. In contrast, the comparators 50, 52 and 54 and the inverters 62, 64 and 66 now co-operate to open a respective one of the NAND-gates 56, 58 and 60 (which are now no longer blocked by a logic-low signal from the AND-gate 68) in accordance with which-ever of the integrator output signals $I_{CA}$, $I_{AB}$ and $I_{BC}$ is greatest in mangitude. Thus, the corresponding output terminal 70, 72 or 74 provides a logic-low output signal indicating that the disturbance has affected two phases, and the identity of the phases involved.

For example, if the disturbance has affected the phases A and B, the output of the integrator 28 will assume a relatively large negative value, whereas the outputs of the remaining two integrators 26 and 30 will assume relatively smaller negative values. Thus, as described above, all of the comparators 34, 36 and 38 will continue to provide logic-high output signals. The comparator 52 will supply a logic-high signal indicating that the integrator output signal $I_{AB}$ is greater (that is more negative) than the integrator output signal $I_{CA}$, and the comparator 54 will provide a logic-low signal indicating that the integrator output signal $I_{AB}$ is likewise greater (that is more negative than the integrator output signal $I_{BC}$. This latter logic signal will be inverted by the inverter 66 with the result that the NAND-gate 58 receives logic-high signals on all of its three inputs and therefore supplies a logic-low signal at its output to the output terminal 72. This is indicative that the disturbance has affected two phases, and that the phases involved are A and B. It can be seen that the NAND-gate 56 receives a logic-low signal from the comparator 54, with the result that both of these NAND-gates continue to supply logic-high signals at their outputs, to the output terminals 70 and 74 respectively.

In the case of a distance protection system, it is necessary both to distinguish single phase disturbances (which require, at most, disconnection only of the phase involved) from disturbances involving more than one phase, and to calculate the distance to the disturbance (to permit its location relative to a protected section of the network, and thus the need for any disconnection at all in that section, to be established). In this latter respect, the signals at the output terminals 42, 44, 46, 70, 72 and 74, in the event of a disturbance, provide a convenient preliminary indication of which phase or phases can be most advantageously involved in a subsequent calculation of the distance and nature of the disturbance. Thus, wasteful calculations involving signals for phases or combinations of phases which will not in fact provide useful information about any particular disturbance can be avoided.

If the apparatus is intended for use in a directional protection system (in which the location of a disturbance is established by comparison of the perceived direction of the disturbance at spaced points on the netword, rather than by calculation of distance) the output terminals 70, 72 and 74, and the associated circuits 50 to 68, can be omitted. In these circumstances, the presence of output signals at both the output terminal 48 and one of the output terminals 42, 44 or 46 indicates a single phase fault, whereas a signal at the terminal 48 alone indicates some other kind of fault involving more than one phase. The directional determination, which can be performed independently of the kind of fault, can then be used in conjunction with these signals to decide whether the respective individual phase, or all three, need be disconnected.

The principles underlying the operation of the apparatus will now be discussed, with reference to FIGS. 2 and 3.

Figure 2:
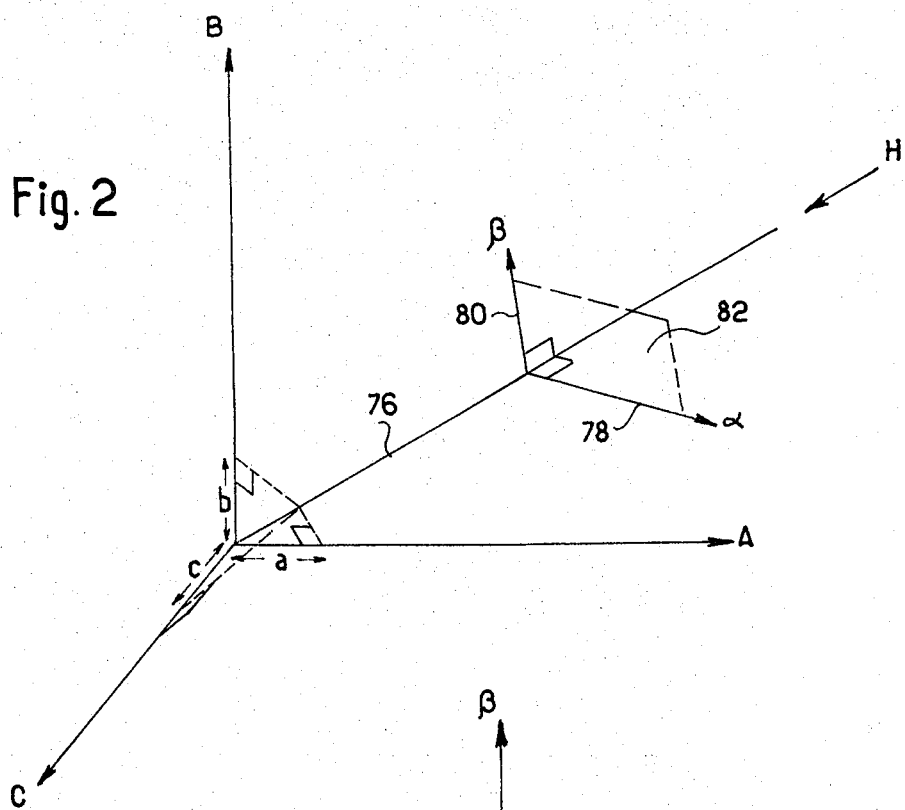
FIG. 2 is an isometric diagram of a three-vector space whose axes correspond to respective ones of the three phases in the transmission network, indicating in particular the homopolar or zero-sequence vector direction.

Referring to FIG. 2, the transient signals supplied by the three filters 16A, 16B and 16C are represented by three mutually orthogonal vector axes A, B and C (it will be understood that the axis C should in reality be considered to project upwards, out of and transverse to the plane of the drawing). A line 76 represents the homopolar, or zero-sequence, vector direction, for which the vector components a, b and c are equal. Two other lines 78 and 80 represent orthogonal axes $\alpha$ and $\beta$ of a plane 82 which is transverse to the zero-sequence vector direction 76. The subsequent discussion involves vectors lying in this plane 82 (whose axes are sometimes called Clarke alpha and beta components), which is shown when viewed directly from above (that is, along the vector direction 76, as indicated by the arrow H) in FIG. 3.

Figure 3:
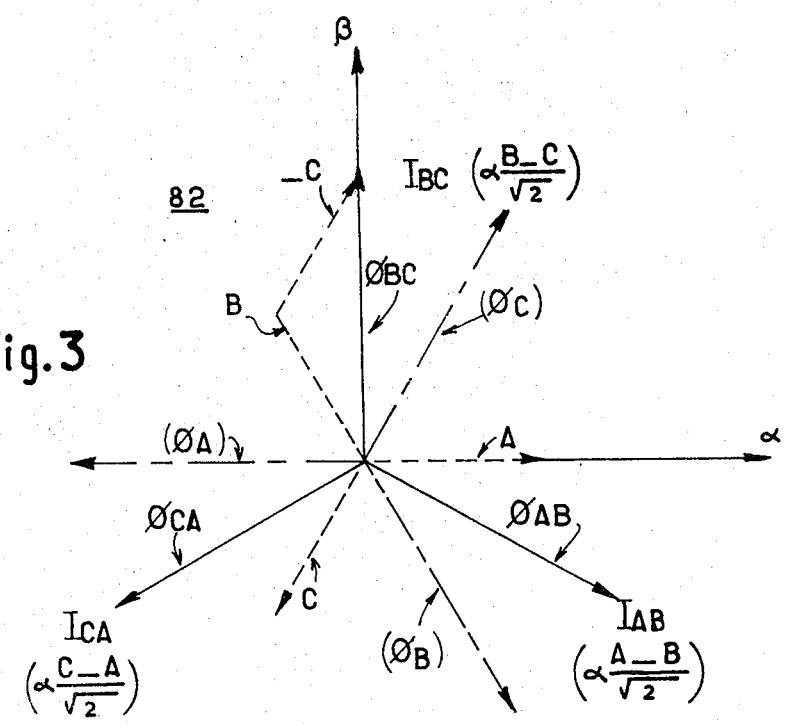
FIG. 3 is a diagram showing vectors lying in a plane alpha-beta which is orthogonal to the homopolar axis shown in FIG. 2.

Referring to FIG. 3, three dotted lines A, B and C represent the projections on to the plane 82 of the axes A, B and C of FIG. 2. It can be seen that the $\alpha$ axis coincides with the projection of the axis A on to this plane. It can be shown that, at least for the duration of a few cycles of the power supply wave form following a disturbance, there is no significant coupling between vector components along the $\alpha$ and $\beta$ axes respectively. Furthermore, any resultant vector (in the three-dimensional space depicted in FIG. 2) formed by combining the three transient-signal vectors along the A, B and C axes, can itself be resolved back into two other components: one component being the projection of the resultant on to the zero-sequence vector direction 76; and another component being the projection of the resultant on to the plane orthogonal to this vector direction 76, that is on to the $\alpha$-$\beta$ plane 82. This latter component, in the plane 82, will have a direction that is indicative of which of the transient-signal vectors A, B or C contributed to the overall resultant vector from which the component is derived by projection on to the plane 82.

Thus, a transient signal appearing only on the phase A axis of FIG. 2 will give rise to a component in the $\alpha$-$\beta$ plane 82 only along the $\alpha$ axis in FIG. 3, as indicated by ($\phi$ A). Likewise, transient signals appleaing only on the phase B or phase C axes of FIG. 2 will give rise to respective components only along the projections of these axes in FIG. 3, as indicated by ($\phi$ B) and ($\phi$ C).

The difference between transient signals involving only, say, phases B and C (due to a disturbance affecting only these two phases) has a component in the plane 82 which, by vector substraction, is along the B axis in FIG. 3, as indicated by $\phi$ BC. It will be noted that this component, not involving phase A, is orthogonal to the component ($\phi$ A) involving only phase A. Likewise, the differences between transient signals involving only phases C and A, or A dans B have respective components $\phi$ CA and $\phi$ CB in the plane 82, which are respectively orthogonal to the components ($\phi$ B) and ($\phi$ C).

The output signals of the integrators 26, 28 and 30 in FIG. 1 are representative of the sum of the squares of the three pairs of differences between the transient signals, so these output signals $I_{CA}$, $I_{AB}$ and $I_{BC}$ are indicative of the magnitudes of the three components $\phi$ CA, $\phi$ AB and $\phi$ BC in FIG. 3. Thus, as noted above, if a disturbance involves only phase A, for example, thereby giving rise only to a transient signal along the phase A axis of FIG. 2 and a component ($\phi$ A) along the $\alpha$ axis of FIG. 3, the component $\phi$ BC (represented by the signal $I_{BC}$), being orthogonal to this axis, will be unaffected and will remain at zero. In contrast, the components $\phi$ CA and $\phi$ AB, not being orthogonal to the $\alpha$ axis, will be affected and will become non-zero. Thus, the continued zero-value of only one of the components $\phi$ BC, $\phi$ CA and $\phi$ AB (that is, of the corresponding signals $I_{BC}$, $I_{CA}$ and $I_{AB}$) indicates a single-phase disturbance, and the identity of the signal involved, in this case $I_{BC}$, indicates that the orthogonal phase (A) is affected. If a disturbance involves two phases, say the phases B and C, the corresponding signal ($I_{BC}$) becomes large, whereas the other two signals ($I_{CA}$ and $I_{AB}$) become small, though not zero. The identity of the largest signal, $I_{BC}$, then indicates directly the phases (B and C) affected.

In the case of a single-phase, the faulty phase will be disconnected, thereby causing another transient signal to appear on the power line 10. However, this second transient will obviously result in a component in the plane 82 in the same direction as for the original, fault-induced transient. Thus the apparatus will not give any spurious indication following such disconnection.

It is envisaged that the circuit shown in FIG. 1 could be modified in various ways. Thus, instead of sensing the current flowing in the phases A, B and C, the apparatus could sense the voltage, or a linear combination of the voltage and current, for each phase. The filter 16 could be placed after the differential amplifies 18 instead of before them. Also the particular pairs of signals C−A, A−B and B−C are only examples: there are obviously various other ways of combining the signals from the three phases A, B and C to determine the magnitudes of vector components lying in the plane 82 illustrated in FIG. 3.

It is required, however, that the combinations are linear and the sum of the coefficients of each linear combination is nil to annul the homopolar component. Combinations such as 2A−B−C could e.g. be contemplated.

Moreover, instead of squaring such combinations, one could form the product of two different combinations provided that the above requirements are met for both.

Nevertheless, the embodiment making use of pairs C−A, A−B, B−C is preferred because it is very easy to implement.

I claim:

1. A method for identifying which of the phases in a N-phase electric-power transmission network has experienced a fault, comprising the steps of
   producing for each phase a first signal representative of the transient variations of an electrical parameter of the respective phase, or of a linear combination of at least two of said parameters;
   generating a set of N second signals as the product of two linear combinations of at least N−1 signals selected among said first signals, the sum of all coefficients for each linear combination being nil, each of said second signals being related to a given phase;
   integrating with respect to time each of said second signals to produce a set of N third signals associated with respective phases;
   generating a fourth signal by combining all of the N first signals in a symmetrical manner with respect to all of said first signals, whereby said fourth signal is independent of the associated phases;
   comparing said fourth signal with each of said third signals to produce comparison signals related to respective phases; and
   identifying the faulty phase in accordance with the comparison signals thus produced.

2. A method according to claim 1, wherein said fourth signal is generated as the sum of said N first signals.

3. A method according to claim 1 or claim 2, wherein, in a three-phase transmission network, each second signal related to a given phase is generated as the square of the difference between the pair of first signals related to the other two phases.

4. A method according to claim 3 for identifying two phases which simultaneously have experienced a fault, comprising the further steps of generating a set of three fifth signals by forming the difference between each pair of said third signals, and producing a logical signal related to each pair of phases by combining in pairs the fifth signals thus generated, the state of said logical signal being indicative of a fault in the respective pair of phases.

5. A method according to claim 1, wherein said electrical parameter is the current in the respective phase.

* * * * *

UNITED STATES PATENT AND TRADEMARK OFFICE
CERTIFICATE OF CORRECTION

PATENT NO. : 4,366,474

DATED : December 28, 1982

INVENTOR(S) : Paul Loewenstein

It is certified that error appears in the above-identified patent and that said Letters Patent are hereby corrected as shown below:

On the title page

In the Abstract, lines 15 and 16, "first signals" should read -- third signals --.

Column 1, lines 59 and 60, "first signals" should read -- third signals --.

In the Claims:

Claim 1, column 8, line 13, "first signals" should read -- third signals --.

Claim 1, column 8, line 14, "first signals" should read -- third signals --.

Claim 2, column 8, lines 22 and 23, "first signals" should read -- third signals --.

Signed and Sealed this

Fifth Day of June 1984

[SEAL]

Attest:

GERALD J. MOSSINGHOFF

*Attesting Officer*  *Commissioner of Patents and Trademarks*